(12) United States Patent
Song et al.

(10) Patent No.: US 9,252,320 B2
(45) Date of Patent: Feb. 2, 2016

(54) THIN FILM STRUCTURES AND DEVICES WITH INTEGRATED LIGHT AND HEAT BLOCKING LAYERS FOR LASER PATTERNING

(71) Applicant: APPLIED MATERIALS, INC., Santa Clara, CA (US)

(72) Inventors: Daoying Song, San Jose, CA (US); Chong Jiang, Cupertino, CA (US); Byung-Sung Leo Kwak, Portland, OR (US); Joseph G. Gordon, II, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/673,249

(22) Filed: Mar. 30, 2015

(65) Prior Publication Data

US 2015/0364638 A1    Dec. 17, 2015

Related U.S. Application Data

(62) Division of application No. 13/570,190, filed on Aug. 8, 2012, now Pat. No. 8,993,443.

(60) Provisional application No. 61/521,212, filed on Aug. 8, 2011.

(51) Int. Cl.
*H01L 21/302* (2006.01)
*H01L 21/461* (2006.01)
(Continued)

(52) U.S. Cl.
CPC .......... *H01L 31/1876* (2013.01); *H01L 31/024* (2013.01); *H01L 31/02164* (2013.01); *H01L 31/0463* (2014.12)

(58) Field of Classification Search
USPC .................................................. 438/690, 693
See application file for complete search history.

(56) References Cited

U.S. PATENT DOCUMENTS

| 4,568,409 A | 2/1986 | Caplan |
| 4,740,431 A | 4/1988 | Little |

(Continued)

FOREIGN PATENT DOCUMENTS

| KR | 10-2010-0130450 A | 12/2010 |
| WO | WO99/03157 A1 | 1/1999 |

(Continued)

OTHER PUBLICATIONS

Dudney, N.J., "Solid-State Thin-Film Rechargeable Batteries," Materials Science and Engineering B 116 (2005), pp. 245-249.

(Continued)

*Primary Examiner* — Errol Fernandes
(74) *Attorney, Agent, or Firm* — Pillsbury Winthrop Shaw Pittman LLP

(57) ABSTRACT

Selective removal of specified layers of thin film structures and devices, such as solar cells, electrochromics, and thin film batteries, by laser direct patterning is achieved by including heat and light blocking layers in the device/structure stack immediately adjacent to the specified layers which are to be removed by laser ablation. The light blocking layer is a layer of metal that absorbs or reflects a portion of the laser energy penetrating through the dielectric/semiconductor layers and the heat blocking layer is a conductive layer with thermal diffusivity low enough to reduce heat flow into underlying metal layer(s), such that the temperature of the underlying metal layer(s) does not reach the melting temperature, $T_m$, or in some embodiments does not reach $(T_m)/3$, of the underlying metal layer(s) during laser direct patterning.

19 Claims, 10 Drawing Sheets

(51) Int. Cl.
*H01L 31/18* (2006.01)
*H01L 31/024* (2014.01)
*H01L 31/0216* (2014.01)
*H01L 31/0463* (2014.01)

(56) References Cited

U.S. PATENT DOCUMENTS

| | | | |
|---|---|---|---|
| 4,780,177 | A | 10/1988 | Wojnarowski et al. |
| 5,724,175 | A | 3/1998 | Hichwa et al. |
| 5,824,374 | A | 10/1998 | Bradley, Jr. et al. |
| 5,995,271 | A | 11/1999 | Zieba et al. |
| 6,094,292 | A | 7/2000 | Goldner et al. |
| 6,764,525 | B1 | 7/2004 | Whitacre et al. |
| 6,841,482 | B2 | 1/2005 | Boyle |
| 7,389,580 | B2 | 6/2008 | Jenson et al. |
| 8,129,822 | B2 * | 3/2012 | Moslehi ............... 257/618 |
| 8,168,265 | B2 * | 5/2012 | Kwak et al. ........... 427/555 |
| 8,168,318 | B2 | 5/2012 | Kwak et al. |
| 8,993,443 | B2 | 3/2015 | Song et al. |
| 2002/0071989 | A1 | 6/2002 | Verma et al. |
| 2003/0064292 | A1 | 4/2003 | Neudecker et al. |
| 2004/0265698 | A1 | 12/2004 | Takada et al. |
| 2006/0286448 | A1 | 12/2006 | Snyder et al. |
| 2008/0029152 | A1 | 2/2008 | Milshtein et al. |
| 2008/0182207 | A1 | 7/2008 | Yamazaki et al. |
| 2009/0032096 | A1 | 2/2009 | Tanaka et al. |
| 2009/0148764 | A1 | 6/2009 | Kwak et al. |
| 2009/0191663 | A1 | 7/2009 | Lechner et al. |
| 2009/0208671 | A1 | 8/2009 | Neih et al. |
| 2009/0229666 | A1 | 9/2009 | Corneille et al. |
| 2010/0323471 | A1 | 12/2010 | Le et al. |
| 2011/0131792 | A1 | 6/2011 | Kwak et al. |
| 2011/0306180 | A1 | 12/2011 | Prabhakar |
| 2012/0318664 | A1 | 12/2012 | Jiang et al. |
| 2012/0321815 | A1 | 12/2012 | Song et al. |
| 2014/0007418 | A1 | 1/2014 | Song et al. |

FOREIGN PATENT DOCUMENTS

| | | |
|---|---|---|
| WO | WO03/069960 A1 | 8/2003 |
| WO | WO 2009/055529 A1 | 4/2009 |
| WO | WO 2010/120601 A2 | 10/2010 |
| WO | WO 2011/037868 A2 | 3/2011 |
| WO | WO 2013/022992 A2 | 2/2013 |
| WO | WO 2013/016082 A2 | 7/2014 |

OTHER PUBLICATIONS

Author Unknown, "Plastic Electronics Using Excimer Laser Ablation—USA," IDTechEx Printed Electronics World, Nov. 5, 2007, 2 pages; available at: http://www.printedelectronicsworld.com/articles/plastic-electronics-using-excimer-laser-ablation-usa-00000740.asp?cssforprinting=true; last viewed Dec. 7, 2012.

Optik Systems web page available at: http://www.opteksystems.com/scribing-patterning; last viewed Dec. 7, 2012.

Supplementary European Search Report Issued Jun. 15, 2015 for EP 12821858.3.

* cited by examiner

THIN FILM STRUCTURES AND DEVICES WITH INTEGRATED LIGHT AND HEAT BLOCKING LAYERS FOR LASER PATTERNING

CROSS-REFERENCE TO RELATED APPLICATIONS

This application is a Divisional of U.S. patent application Ser. No. 13/570,190, filed Aug. 8, 2012, (Now U.S. Pat. No. 8,993,443), which claims the benefit of U.S. Provisional Application No. 61/521,212 filed Aug. 8, 2011, all of which are incorporated herein by reference in their entirety.

This invention was made with U.S. Government support under Contract No. W15P7T-10-C-H604 awarded by the U.S. Department of Defense. The Government has certain rights in the invention.

FIELD OF THE INVENTION

Embodiments of the present invention relate to mask-less fabrication processes for thin film structures and devices, and more specifically to structures and devices including light and heat blocking layers for improving laser patterning.

BACKGROUND OF THE INVENTION

Laser processes for thin film structures and devices such as thin film batteries (TFBs), electrochromic (EC) devices, solar cells, etc. are used to selectively ablate/scribe various layers from the front side (thin film side) of the substrate, leaving certain layers intact and undamaged. For selective laser ablation/scribing of semiconductors/dielectrics from metals, heat easily transfers from semiconductors/dielectrics to underlying metals due to the high thermal diffusivity of metals. See FIG. 1 which is an illustration of the estimated extent of the heat zone 105 in which laser ablation damage by a stationary laser beam 101 may occur—the heat zone penetrates the metal layer 103 and even extends into the substrate/underlying layer 104; estimated isotherms 106 are shown within the heat zone 105—the isotherms are not calculated or measured, but are estimated based on the observed extent of laser damage. Moreover, part of the laser light may penetrate through the semiconductors/dielectrics 102 and enter into the metals 103, which can be absorbed by the metals and then further increase the temperature of the metals. The temperature of underlying metals can reach up to their vaporization point during laser ablation of semiconductors/dielectrics, which may lead to melting and vaporization of the underlying metals, and result in functional impairment of the thin film devices. For example, in TFB processing it may be desirable to remove, using laser ablation from the front side, dielectric layers from over conductive current collector layers to allow for formation of bonding pads. See FIG. 2 which illustrates a typical thin film battery (TFB) stack, including a substrate 201, a cathode current collector (CCC) 202, a cathode (e.g., $LiCoO_2$) 203, an electrolyte (e.g., LiPON) 204, an anode (e.g., Li, Si—Li and other intercalated oxides) 205, an anode current collector (ACC) and a protective coating 207. However, during laser direct patterning of TFBs, the current collector layer (usually less than 1 micron of Ti/Au) may reach high temperatures of up to their vaporization point when the electrolyte (LiPON, e.g.) and cathode ($LiCoO_2$, e.g.) are being removed by laser ablation. This high temperature causes the current collector to melt or even vaporize, and inevitably reduces current collection efficiency and overall TFB charging/discharging efficiency.

Clearly, there is a need for improved approaches to laser direct patterning of TFB, EC and similar structures and devices that does not impair the function of the remaining layers of the thin film structures and devices.

SUMMARY OF THE INVENTION

In general, the invention relates to mask-less laser direct patterning of thin film structures and devices, such as solar cells, electrochromics, and TFBs where the ablation needs to stop at a specific layer with high selectivity and does not affect the underlying layer(s), for example a metal electrical contact layer for a TFB. According to embodiments of the present invention, selective removal of specified layers by laser direct patterning is achieved by including heat and light blocking layers in the device/structure stack immediately below the specified layers which are to be removed by ablation. (Here "below" is being defined by the direction of the laser beam—the laser beam reaches the blocking layers after first passing through the specified layers.) The light blocking layer may be a layer of metal with a high melting point and of sufficient thickness to absorb and/or reflect all the laser light penetrating through the specified layers, and the heat blocking layer may be a conductive layer with thermal diffusivity low enough to ensure a majority of the heat from the laser is contained in the layers to be removed. The thickness of the light and heat blocking layers and the thermal diffusivity of the heat blocking layer may be specified to ensure that the temperature of the underlying layer is kept below its melting point, $T_m$, during the laser ablation process. Furthermore, the thickness of the light and heat blocking layers and the thermal diffusivity of the heat blocking layer may be specified to ensure that the temperature of the underlying layer is kept below the recrystallization temperature during the laser ablation process—typically $(T_m)/3$ for metals. Selectivity may be achieved between metal layers and dielectric or semiconductor layers, or even between different metal layers without affecting/damaging underlying metal layers, providing light and heat blocking layers are incorporated between them. In some embodiments the heat and light blocking layers may be a single layer. In other embodiments the order of the light blocking layer and the heat blocking layer in the stack may be reversed. Furthermore, laser irradiation may be from above or below the substrate—in the latter case the laser light passes through the substrate before reaching the device layers to be ablated/removed.

According to some embodiments of the present invention, a thin film device, compatible with laser direct patterning by a laser beam for selective removal of dielectric and/or semiconductor layers, may comprise: a substrate; a first device layer covering said substrate; a first heat blocking layer covering said first device layer, a first light blocking layer covering said first heat blocking layer; and a second device layer covering said first light blocking layer; wherein said first light blocking layer is a layer of metal that absorbs or reflects a portion of the laser energy reaching said first light blocking layer and said first heat blocking layer is a conductive layer with thermal diffusivity, D, low enough to reduce heat flow through said first heat blocking layer such that the temperature of an adjacent device layer exceeds the melting temperature, Tm, of said adjacent device layer during laser direct patterning.

According to further embodiments of the present invention, a method of laser direct patterning a thin film device by a laser beam for selective removal of dielectric and/or semiconductor layers, may comprise: providing a thin film device as described above; and laser direct patterning said thin film device, said laser beam removing a laser irradiated portion of said second device layer, wherein said laser beam passes through said second device layer before reaching said first light blocking layer. Alternatively, or in addition, laser direct patterning may remove a laser irradiated portion of said first device layer, wherein said laser beam passes through said first device layer before reaching said first heat blocking layer.

A selective laser patterning tool, and apparatus including the selective laser patterning tool, according to the present invention are described herein.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
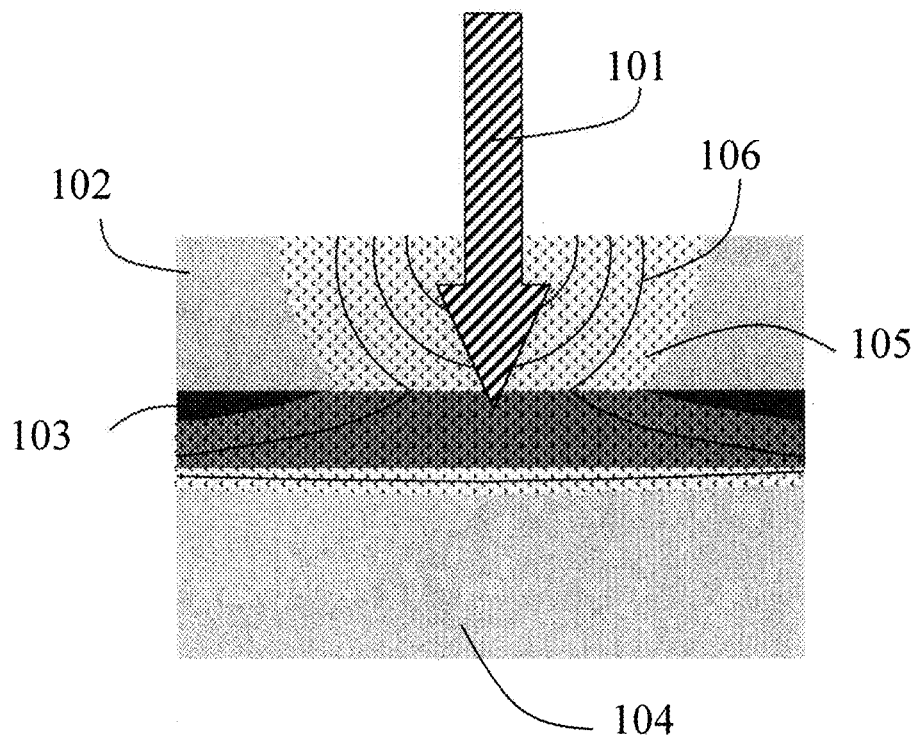
FIG. 1 is a cross-sectional representation of a layered structure exposed to a laser beam during a laser patterning process.
Figure 2:
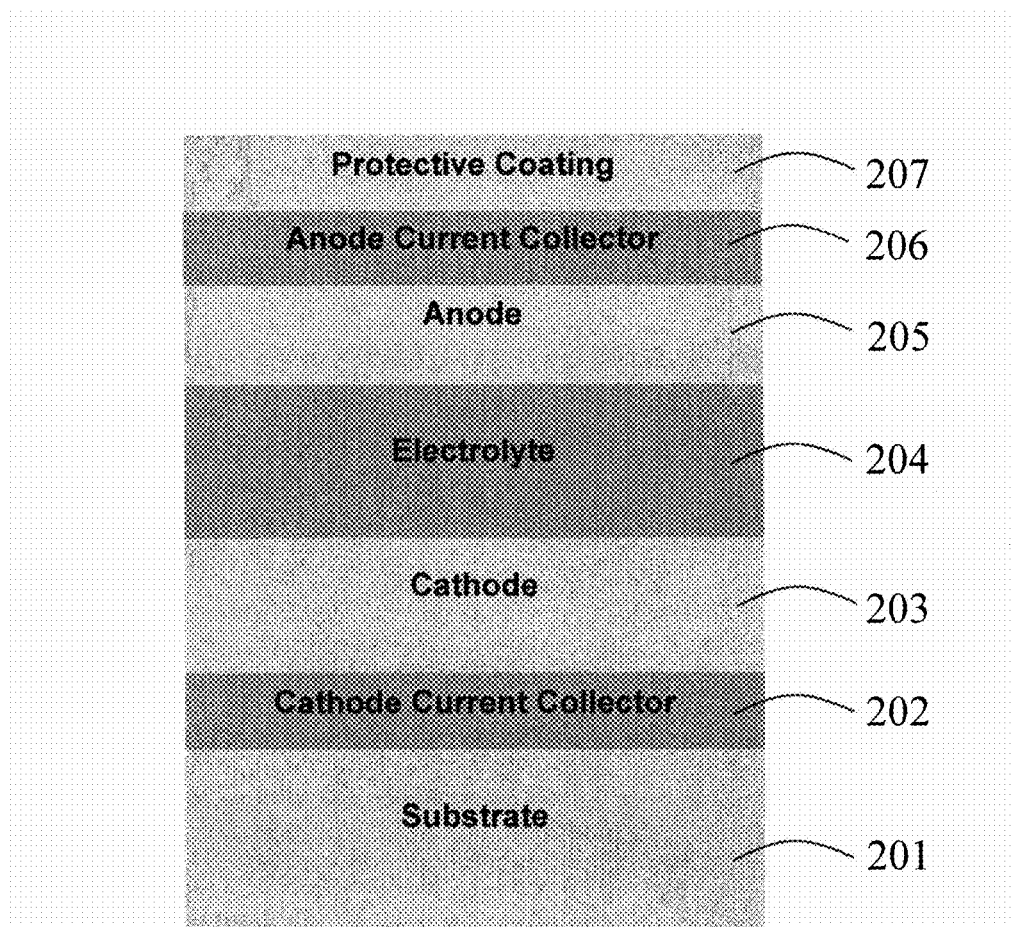
FIG. 2 is a cross-sectional representation of a thin film battery (TFB)
Figure 3:
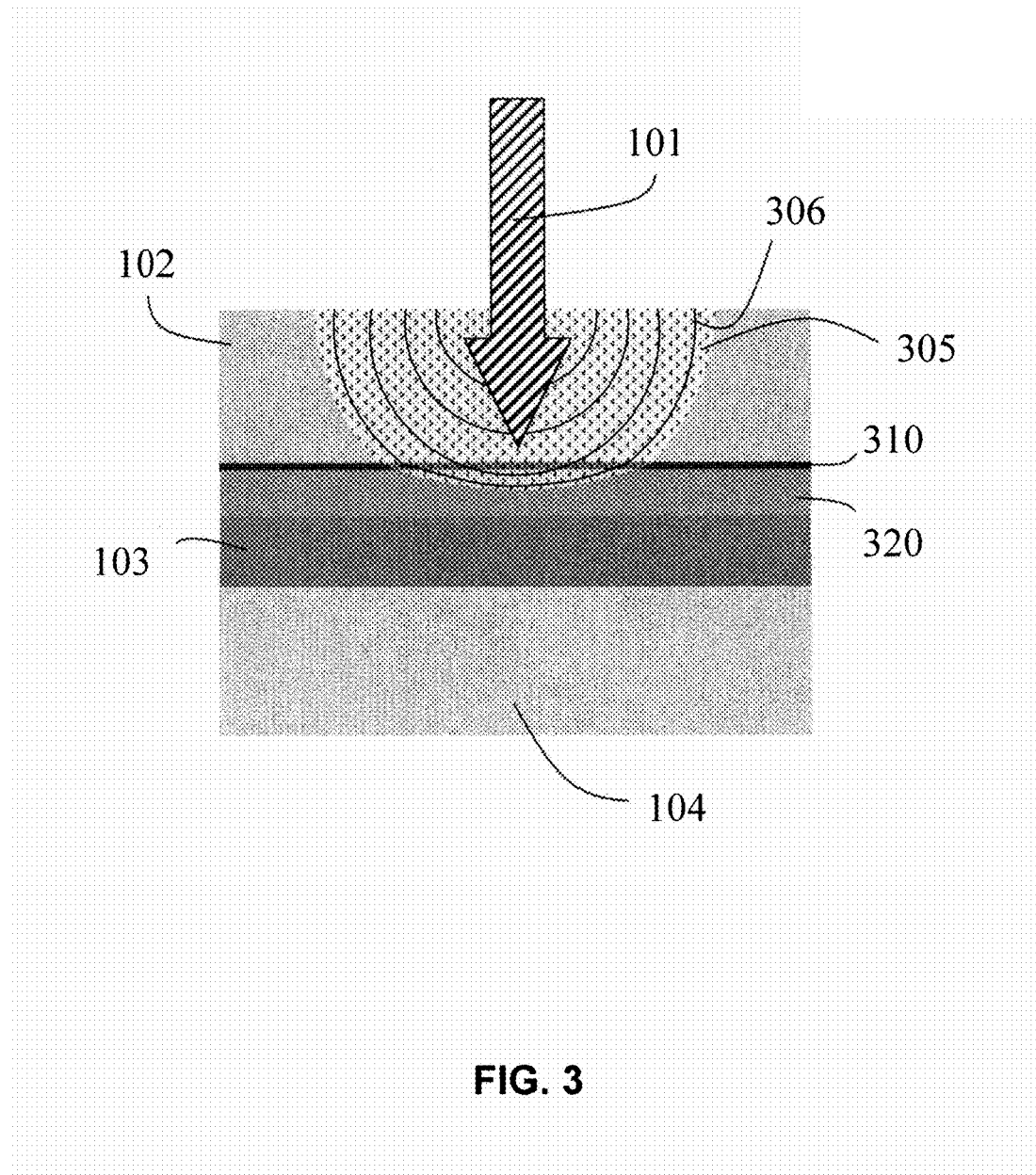
FIG. 3 is a cross-sectional representation of a layered structure with a light blocking layer and a heat blocking layer exposed to a laser beam during a laser patterning process, according to some embodiments of the present invention.

In general, the present invention relates to mask-less laser direct patterning of thin film structures and devices, such as solar cells, electrochromics, and TFBs where the ablation needs to stop at a specific layer with high selectivity and does not affect the underlying layer, for example a metal electrical contact layer for a TFB. According to embodiments of the present invention selective removal of specified layers by laser direct patterning is achieved by including heat and light blocking layers in the device/structure stack immediately below the specified layers which are to be removed by ablation. (Here "below" is being defined by the direction of the laser beam—the laser beam reaches the blocking layers after first passing through the specified layers. See FIG. 3 with light blocking layer 310 and heat blocking layer 320 integrated into the device stack.) The light blocking layer may be a layer of metal of high melting temperature and sufficient thickness to absorb and/or reflect all the laser light penetrating through the specified layers; furthermore, the light blocking layer may have a mirror-like surface or may have a rough surface. The heat blocking layer may be a layer with thermal diffusivity low enough to ensure a majority of the heat from the laser is contained in the dielectric/semiconductor layers. The thickness of the light and heat blocking layers and the thermal diffusivity of the heat blocking layer may be specified to ensure that the temperature of the underlying layer is kept below its melting point, $T_m$, during the laser ablation process. Furthermore, the thickness of the light and heat blocking layers and the thermal diffusivity of the heat blocking layer may be specified to ensure that the temperature of the underlying layer is kept below the recrystallization temperature during the laser ablation process—typically $(T_m)/3$ for metals. Selectivity may be achieved between metal layers and dielectric or semiconductor layers, or even between different metal layers without affecting/damaging underlying metal layers, providing light and heat blocking layers are incorporated between them. A comparison of FIG. 3 and FIG. 1 illustrates the function of the heat blocking layer 320 to stop the heat zone 305 from extending into the metal layer 103. The isotherms 306 in FIG. 3 indicate a higher temperature gradient within the device stack in the heat blocking layer 320; the isotherms are not calculated or measured, but are estimated based on the observed extent of laser damage. In some embodiments the heat and light blocking layers may be a single layer—a single layer of thermoelectric metal material, for example. In other embodiments the order of the light blocking layer and the heat blocking layer in the stack may be reversed. The light and heat blocking layers may be integrated into the stack while avoiding introducing stress or surface morphology issues into the stack. In some embodiments, for device functionality, both the light blocking and heat blocking layers must be electrically conductive—for example, in a TFB when used immediately above the CCC in the device stack.

Figure 4:
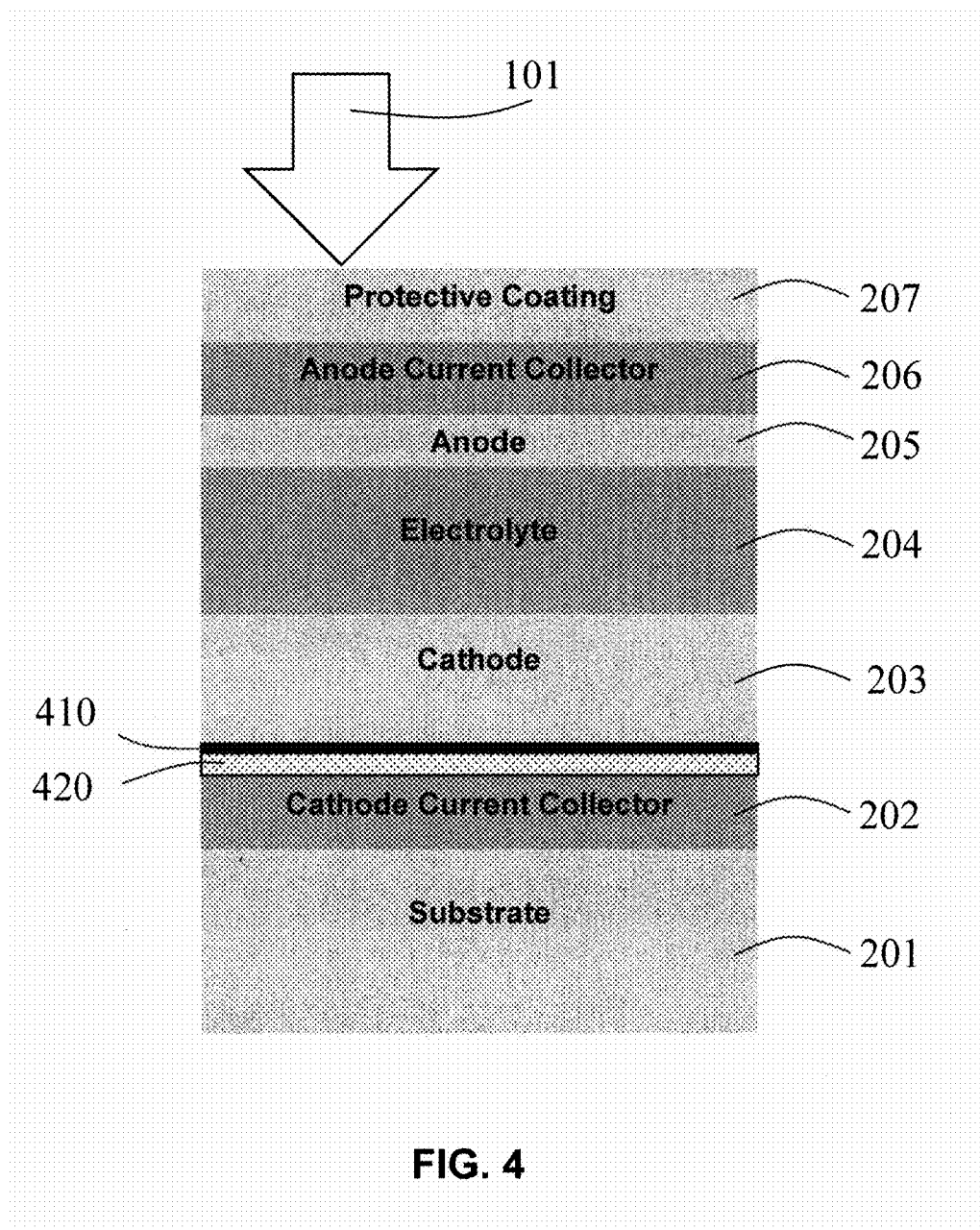
FIG. 4 is a cross-sectional representation of a thin film battery (TFB) with a light blocking layer and a heat blocking layer, according to some embodiments of the present invention.

FIG. 4 provides an example of a light blocking layer 410 and a heat blocking layer 420 incorporated into a TFB for protection of the cathode current collector during laser patterning. The laser light blocking layer 410 absorbs and/or reflects all or a majority of the laser light that passes through the stack of layers, including one or more of a protective coating 207, anode current collector (ACC) 206, anode 205, electrolyte 204 and cathode 203, and the heat blocking layer 320 limits diffusion of heat generated in the stack to the cathode current collector (CCC) 202 during laser processing of the stack. The material properties and thicknesses of the light and heat blocking layers are chosen to keep the temperature of the cathode current collector below $T_m$ to avoid melting of the CCC, and in some embodiments below the recrystallization temperature, which is approximately $(T_m)/3$ for metals, to avoid recrystallization of the CCC during laser ablation of the stack. Moreover, the efficiency of the laser ablation process is increased due to the greater concentration of heat in the stack when compared with processing a TFB without light and heat blocking layers.

In the example of the TFB of FIG. 4, the light blocking layer 410 may be a very thin metal layer, for example a gold film less than 100 Å thick, which can absorb and/or reflect laser light penetrating through the semiconductors/dielectrics of the stack. The heat blocking layer 420 may be a thin (generally greater than 1000 Å for nano-second lasers and greater than 100 Å for pico-second lasers) conductive layer but with very low thermal diffusivity, for example, ITO (indium tin oxide) with thermal diffusivity of $1.2 \times 10^{-2}$ cm$^2$/s and titanium with thermal diffusivity of $6.4 \times 10^{-2}$ cm$^2$/s. Note that the thermal diffusivity of the heat blocking layer is generally less than 0.1 cm$^2$/s and the thickness of the heat blocking layer is normally close to or larger than the diffusion length—the diffusion length is given by $\sqrt{(D\tau)}$ where $\tau$ is the laser pulse duration and D is the thermal diffusivity of the material. The light and heat blocking layers may be combined into one layer as long as this layer is thick enough to absorb most of the laser light which is not reflected and the thermal diffusivity is sufficiently poor to keep the temperature of the CCC below $T_m$, and in some embodiments below $(T_m)/3$. For example, a 100 Å thick titanium film can be used for both light and heat blocking layers when pico-second lasers are used for laser patterning.

Figure 5:
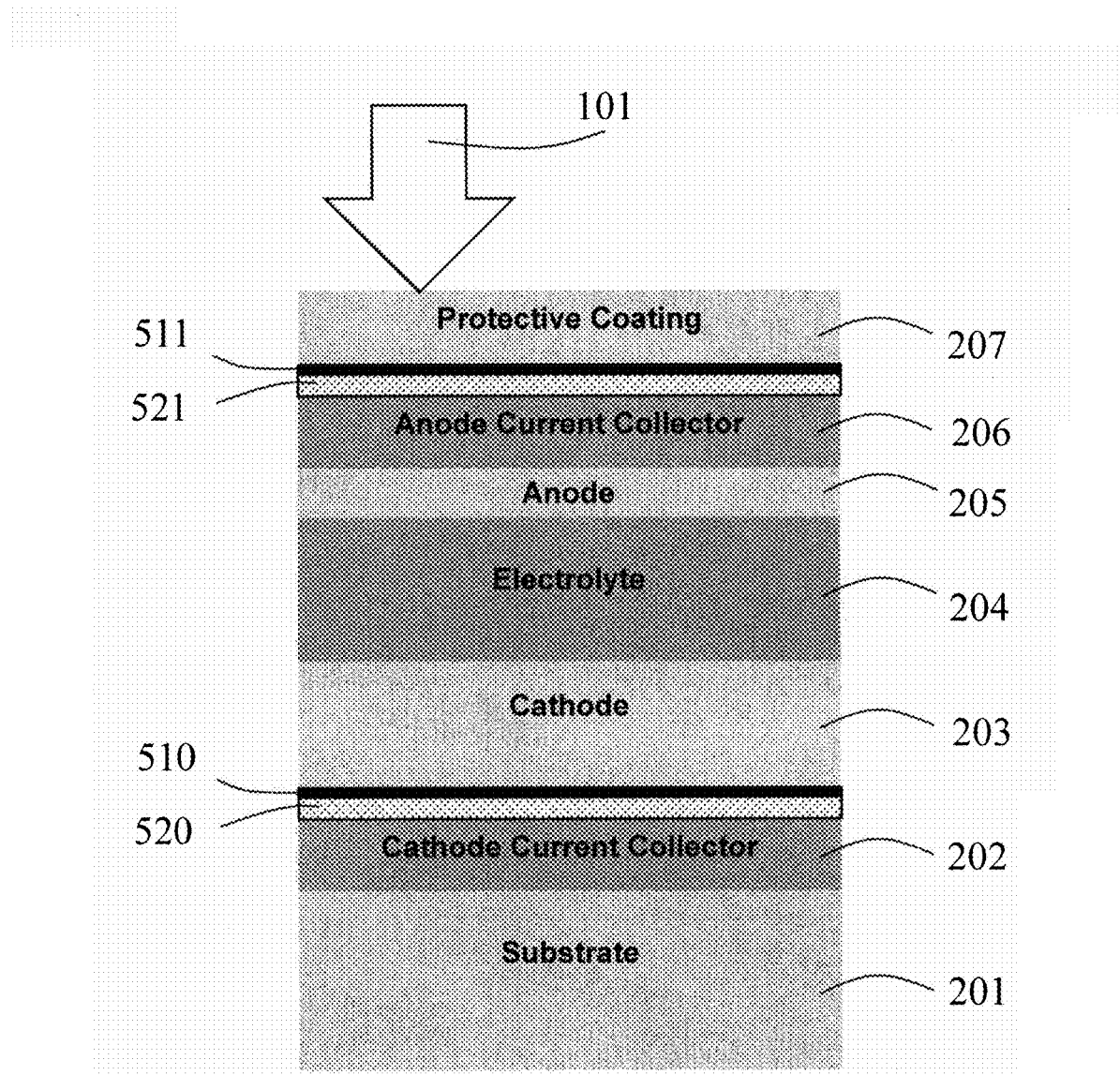
FIG. 5 is a cross-sectional representation of a thin film battery (TFB) with two light blocking layers and two heat blocking layers, according to some embodiments of the present invention.

In some embodiments of the present invention multiple pairs of light and heat blocking layers may be incorporated into a structure or device stack. FIG. 5 shows an example of the incorporation of two pairs of light and heat blocking layers in a TFB stack. Light blocking layer 511 and heat blocking layer 512 may be used for protecting the semiconductor/dielectric stack (layers 203, 204 205 and 206) while laser patterning the protective coating 207, and light blocking layer 510 and heat blocking layer 520 may be used for protecting the CCC 202 while laser patterning the semiconductor/dielectric stack. Light and heat blocking layers may be placed between other layers of the TFB, although there may be a further requirement to match certain material properties if they are placed between a cathode with high thermal conductivity and the electrolyte or between an electrolyte with high thermal conductivity and the anode. Note that when using more than one pair of light and heat blocking layers, each pair may be used to create a different pattern.

Figure 6:
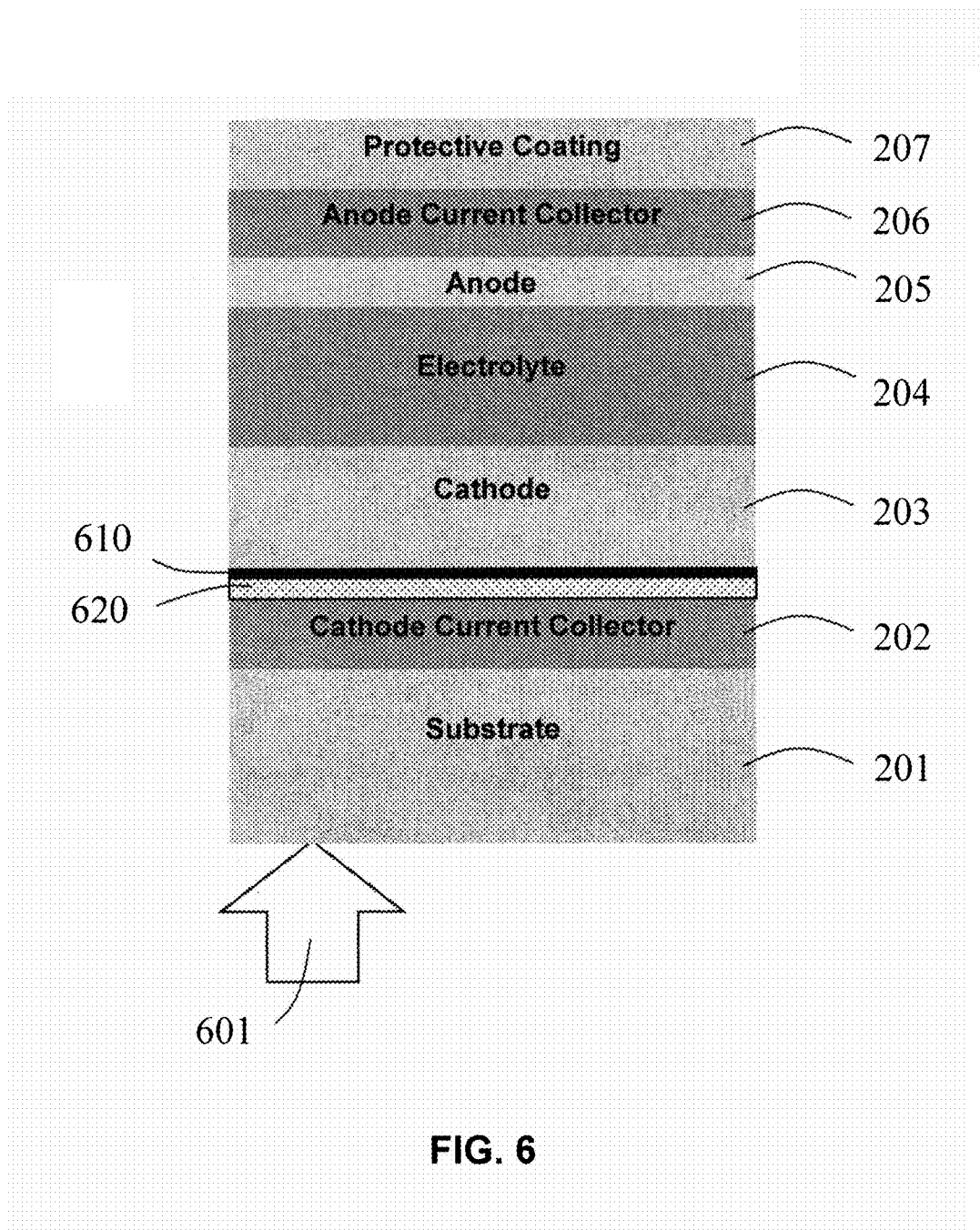
FIG. 6 is a cross-sectional representation of a thin film battery (TFB) with a light blocking layer and a heat blocking layer and a laser beam incident on the TFB structure through the substrate, according to some embodiments of the present invention.

In further embodiments of the present invention with light and heat blocking layers die patterning may be required through the substrate, as shown in FIG. 6 for a TFB. The laser 601 is used from the back of the substrate—in other words the laser light passes through the substrate before reaching the layers to be removed—which requires a substrate with suitable optical properties (low absorption at the laser wavelength). For instance, UV-VIS (ultraviolet-visible) lasers can be used for die patterning from the substrate side if the substrate is glass, or IR (infrared) lasers can be used for silicon substrates. The removal of "upper layers" is an "explosion" process which occurs prior to the melting of the "upper" layers; this "explosion" process only needs a small amount of laser fluence, for instance, less than 1 J/cm$^2$ for a typical TFB stack on a glass substrate. In the stack shown in FIG. 6, the heat from the laser may be sufficient in the CCC 202 to melt and vaporize the CCC, explosively removing the stack of layers above the CCC (this stack may include layers 203, 204, 205, 206 and 207, as well as light and heat blocking layers 610 and 620) from the substrate and device. Note that light and heat blocking layers are not always required for this "explosion" process, but may help in some cases where the heat blocking layer concentrates heat in a layer below the heat blocking layer (the CCC in this example). Note that the "explosion" process generates particulates and molten material that may redeposit on the device unless precautions are taken. However, integration schemes may be developed that mitigate potential redeposition problems.

Furthermore, some embodiments of the present invention include using a single pair of light and heat blocking layers to create two different patterns by direct laser patterning from both the top of the stack and through the substrate—patterning through the substrate being used to define separate devices on a substrate and patterning from the top of the stack being used to pattern the stack above the light and heat blocking layers. Different lasers may be required to create the two patterns.

A method of completely removing a stack of layers from areas of a substrate using a laser, wherein the laser light passes through the substrate before reaching the layers to be removed, and wherein the stack includes a first layer over the substrate, a heat blocking layer over the first layer, and a light blocking layer over the heat blocking layer, may include: irradiating an area of the stack of layers with a laser beam from the backside of the substrate, the laser beam penetrating the first layer through the substrate, wherein the first layer is ablated and blows the entire stack above the first layer off the surface of the substrate where the laser has passed. The light blocking layer is a layer of metal that absorbs or reflects a first part of the laser energy penetrating through the substrate and first layer and the heat blocking layer is an electrically conductive layer with thermal diffusivity low enough to ensure the temperature of the first layer over the substrate exceeds the melting temperature of said first layer.

Conventional laser scribe or laser projection technology may be used for the selective laser patterning processes of the present invention. The number of lasers may be: one, for example a UV/VIS laser with picosecond pulse width (selectivity controlled by laser fluence/dose); two, for example a combination of UV/VIS and IR nanosecond and picosecond lasers (selectivity controlled by laser wavelength/fluence/dose); or multiple (selectivity controlled by laser wavelength/fluence/dose). The scanning methods of a laser scribe system may be stage movement, beam movement by Galvanometers or both. The laser spot size of a laser scribe system may be adjusted from 100 microns to 1 cm in diameter. The laser area at the substrate for a laser projection system may be 5 mm$^2$ or larger. Furthermore, other laser types and configurations may be used.

Figure 7:
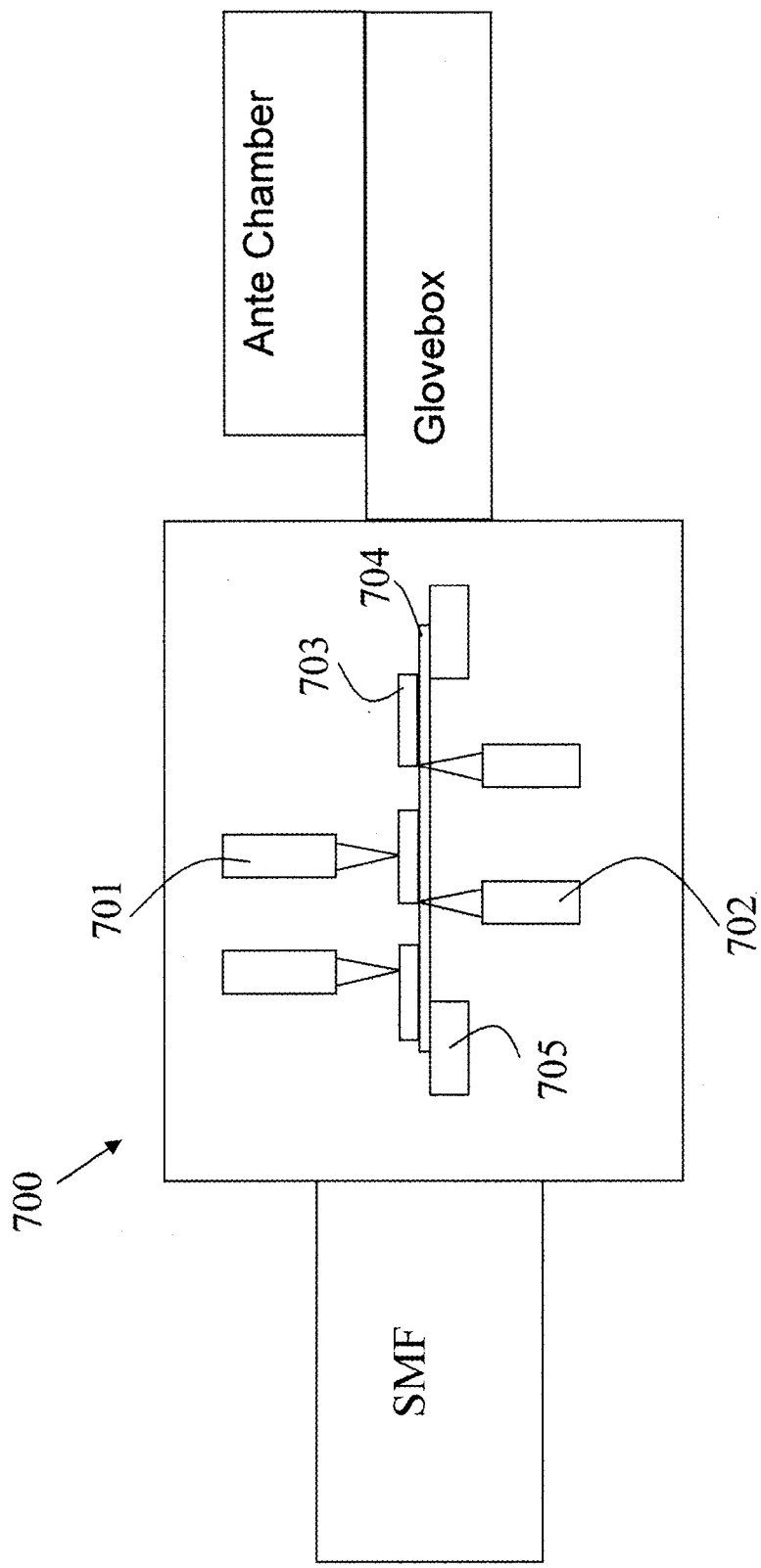
FIG. 7 is a schematic of a selective laser patterning tool, according to some embodiments of the present invention.

FIG. 7 is a schematic of a selective laser patterning tool 700, according to embodiments of the present invention. Tool 700 includes lasers 701 for patterning devices 703 on a substrate 704. Furthermore, lasers 702 for patterning through the substrate 704 are also shown, although lasers 701 may be used for patterning through the substrate 704 if the substrate is turned over. A substrate holder/stage 705 is provided for holding and/or moving the substrate 704. The stage 705 may have apertures to accommodate laser patterning through the substrate. Tool 700 may be configured for substrates to be stationary during laser ablation, or moving—the lasers 701/702 may also be fixed or movable; in some embodiments both the substrate and the lasers may be movable in which case the movement is coordinated by a control system. A stand-alone version of tool 700 is shown in FIG. 7, including an SMF and also a glovebox and antechamber. The embodiment shown in FIG. 7 is one example of a tool according to the present invention—many other configurations of the tool are envisaged, for example, the glove box may not be necessary in the case of lithium-free TFBs. Furthermore, the tool 700 may be located in a room with a suitable ambient, like a dry-room as used in lithium foil manufacturing.

Figure 8:
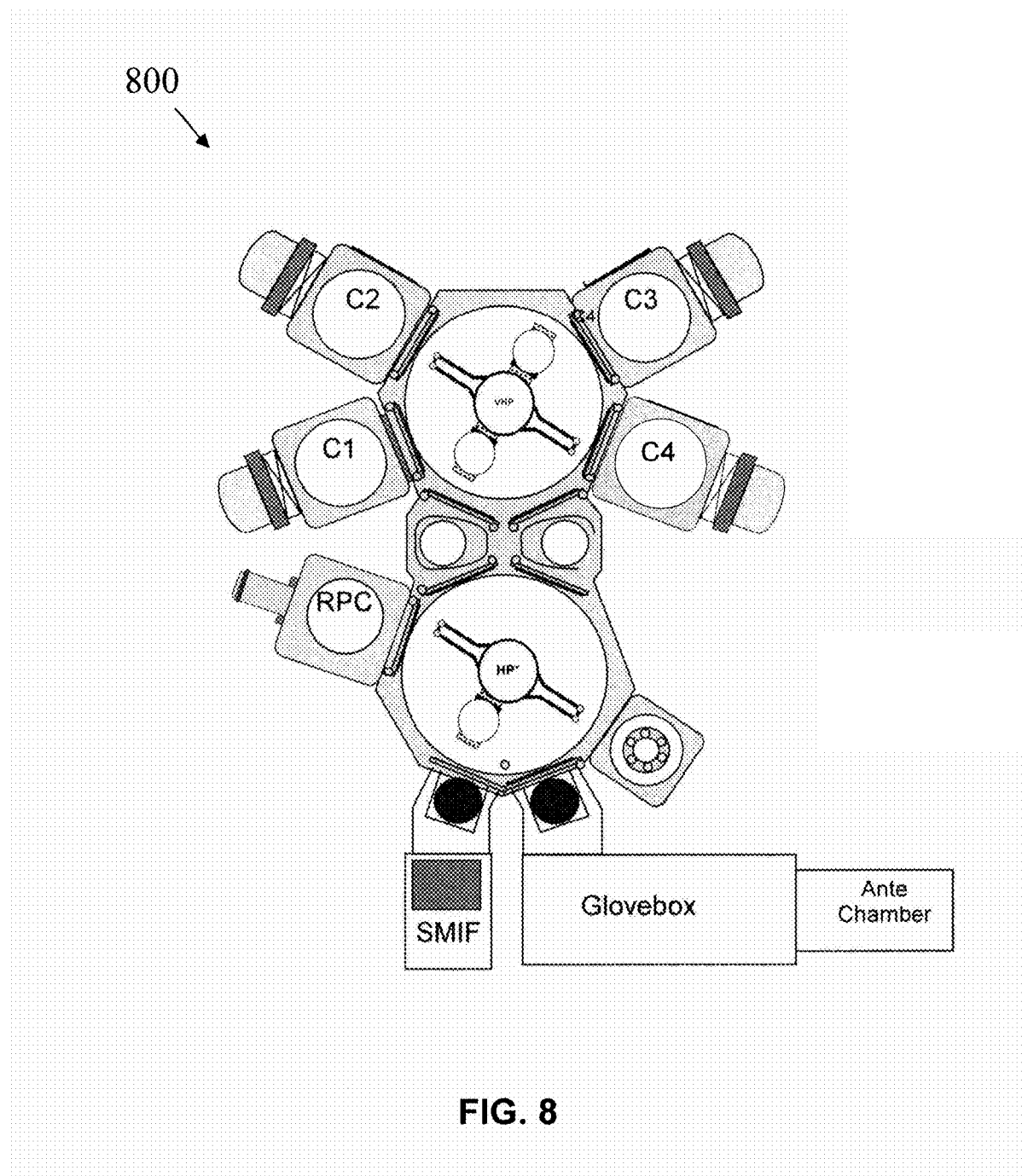
FIG. 8 is a schematic illustration of a thin film deposition cluster tool for TFB fabrication, according to some embodiments of the present invention.

FIG. 8 is a schematic illustration of a processing system 800 for fabricating a TFB device according to some embodiments of the present invention. The processing system 800 includes a standard mechanical interface (SMIF) to a cluster tool equipped with a reactive plasma clean (RPC) chamber and process chambers C1-C4, which may be utilized in the process steps described above. A glovebox may also be attached to the cluster tool. The glovebox can store substrates in an inert environment (for example, under a noble gas such as He, Ne or Ar), which is useful after alkali metal/alkaline earth metal deposition. An ante chamber to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point as such is used by lithium foil manufacturers.) The chambers C1-C4 can be configured for process steps for manufacturing thin film battery devices which may include, for example: deposition of a TFB stack as described above and selective laser patterning of the stack. Examples of suitable cluster tool platforms include AKT's display cluster tools, such as the Generation 10 display cluster tools or Applied Material's Endura™. and Centura™ for smaller substrates. It is to be understood that while a cluster arrangement has been shown for the processing system 400, a linear system may be utilized in which the processing chambers are arranged in a line without a transfer chamber so that the substrate continuously moves from one chamber to the next chamber.

Figure 9:
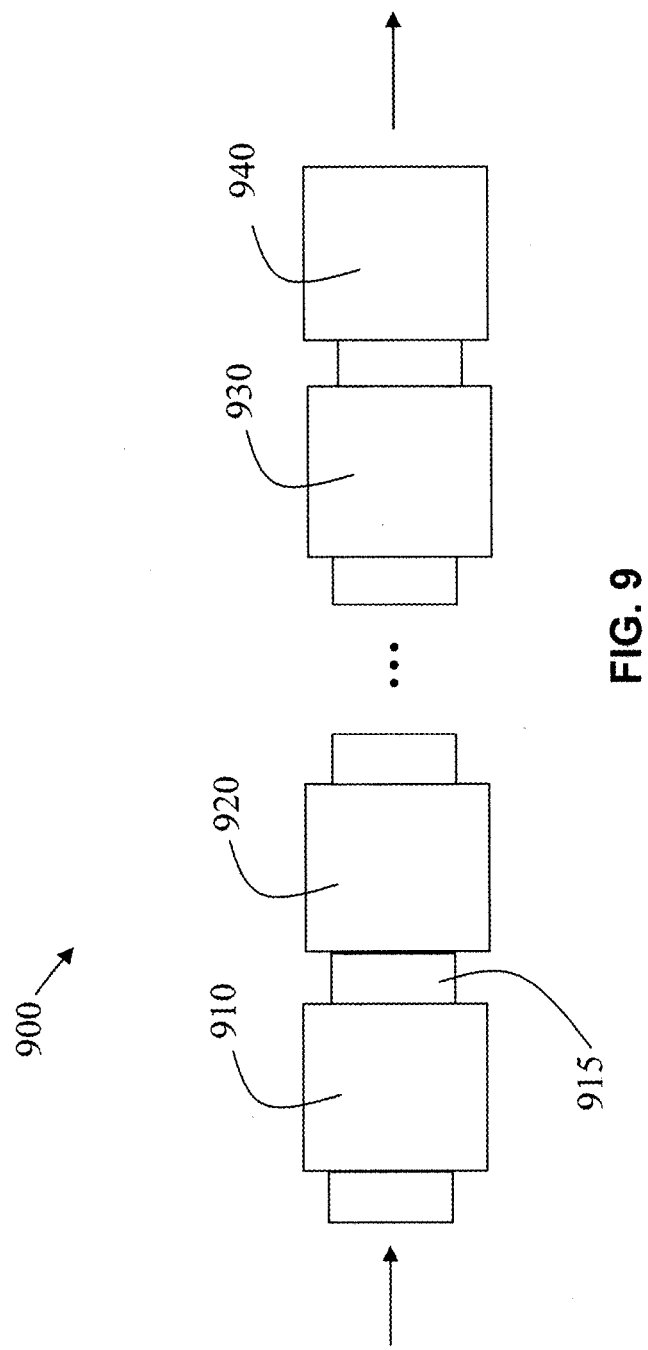
FIG. 9 is a representation of a thin film deposition system with multiple in-line tools for TFB fabrication, according to some embodiments of the present invention.

FIG. 9 shows a representation of an in-line fabrication system 500 with multiple in-line tools 910, 920, 930, 940, etc., according to some embodiments of the present invention. In-line tools may include tools for depositing and patterning all the layers of a TFB device. Furthermore, the in-line tools may include pre- and post-conditioning chambers. For example, tool 910 may be a pump down chamber for establishing a vacuum prior to the substrate moving through a vacuum airlock 915 into a deposition tool 920. Some or all of the in-line tools may be vacuum tools separated by vacuum airlocks 915. Note that the order of process tools and specific process tools in the process line will be determined by the particular TFB device fabrication method being used—specific examples of which are provided above. Furthermore, substrates may be moved through the in-line fabrication system oriented either horizontally or vertically. Yet furthermore, selective laser patterning modules may be configured for substrates to be stationary during laser ablation, or moving.

Figure 10:
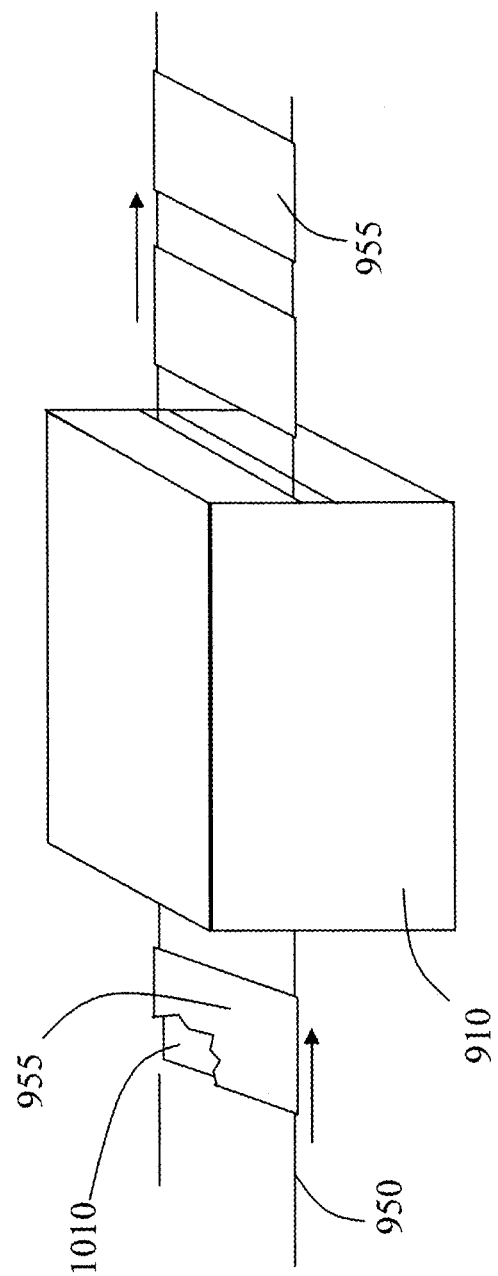
FIG. 10 is a representation of an in-line deposition tool for TFB fabrication, according to some embodiments of the present invention.

In order to illustrate the movement of a substrate through an in-line fabrication system such as shown in FIG. 9, in FIG. 10 a substrate conveyer 950 is shown with only one in-line tool 910 in place. A substrate holder 955 containing a substrate 1010 (the substrate holder is shown partially cut-away so that the substrate can be seen) is mounted on the conveyer 950, or equivalent device, for moving the holder and substrate through the in-line tool 910, as indicated. Suitable in-line platforms for processing tool 910 may be Applied Material's Aton™ and New Aristo™.

An apparatus for forming electrochemical devices, such as thin film batteries, according to embodiments of the present invention may comprise: a first system for blanket depositing on a substrate a stack including a cathode current collector layer, a heat blocking layer, a light blocking layer, a cathode layer, an electrolyte layer; an anode layer, an anode current collector layer and a protective coating layer; and a second system for direct laser patterning the stack. The first systems may be a cluster tool, an in-line tool, stand-alone tools, or a combination of one or more of the aforesaid tools, and the second system may be a stand-alone tool or may be integrated into the first system. Similar apparatus may be used for fabricating solar devices, etc., where the first system is configured for depositing the stack required for the specific device, and the heat and light blocking layers, and the second system is for direct laser patterning the stack, as described above.

Although the present invention has been described herein with reference to TFBs, the teaching and principles of the present invention may also be applied to improved methods for fabricating other thin film structures and devices, such as solar cells and other electrochemical devices, such as electrochromic devices, where laser ablation needs to stop at a specific layer with high selectivity and not affect the underlying layer.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of laser direct patterning a thin film device by one or more laser beams for selective removal of dielectric and/or semiconductor layers, comprising:
   providing a thin film device comprising:
      a substrate;
      a first device layer covering said substrate;
      a first heat blocking layer covering said first device layer,
      a first light blocking layer covering said first heat blocking layer; and
      a second device layer covering said first light blocking layer; and
   laser direct patterning said thin film device using a first laser beam, said laser direct patterning removing a laser irradiated portion of said first device layer, wherein said first laser beam passes through said first device layer before reaching said first heat blocking layer, and wherein portions of said first heat blocking layer, said first light blocking layer and said second layer corresponding to said irradiated portion of said first device layer are removed with the removal of said irradiated portion of said first device layer;
   wherein said first light blocking layer is a layer of metal that absorbs or reflects a portion of the laser energy from a first laser beam penetrating through said first device layer toward said second device layer and said first heat blocking layer is a conductive layer with thermal diffusivity, D, low enough to reduce heat flow into said second device layer from said first device layer such that the temperature of said first device layer reaches the melting temperature, $T_m'$, of said first device layer during laser direct patterning with said first laser beam.

2. The method of claim 1, further comprising laser direct patterning said thin film device using a second laser beam, the second laser direct patterning removing a laser irradiated portion of said second device layer, wherein said second laser beam passes through said second device layer before reaching said first light blocking layer, and wherein said first light blocking layer is a layer of metal that absorbs or reflects a portion of the laser energy from said second laser beam penetrating through said second device layer toward said first device layer and said first heat blocking layer is a conductive layer with thermal diffusivity, D, low enough to reduce heat flow into said first device layer from said second device layer such that the temperature of said first device layer does not reach the melting temperature, $T_m'$, of said first device layer during laser direct patterning with said second laser beam.

3. The method of claim 1, wherein said substrate is a glass substrate and said first laser beam is generated by an ultraviolet-visible laser.

4. The method of claim 3, wherein said ultraviolet-visible laser is a picosecond laser.

5. The method of claim 1, wherein said substrate is a silicon substrate and said first laser beam is generated by an infrared laser.

6. The method of claim 5, wherein said infrared laser is a picosecond laser.

7. The method of claim 1, wherein said substrate is a glass substrate and said first laser beam is generated by a visible laser.

8. The method of claim 7, wherein said visible laser is a picosecond laser.

9. The method of claim 1, wherein the thermal diffusivity of said heat blocking layer is less than 0.1 cm$^2$/s.

10. The method of claim 1, wherein said first heat blocking layer is a conductive layer with thermal diffusivity low enough to reduce heat flow into said first device layer from said second device layer such that the temperature of said first device layer does not reach $(T_m)/3$ of said first device layer during laser direct patterning.

11. The method of claim 1, wherein the thickness of said first heat blocking layer is greater than the thermal diffusion length, $\sqrt{(D\tau)}$, wherein $\tau$ is the laser pulse duration.

12. The method of claim 1, wherein said first light blocking layer and said first heat blocking layer are the same layer.

13. The method of claim 12, wherein said first light blocking layer is a 10 nm layer of titanium and said laser beam is a beam generated by a picosecond laser.

14. The method of claim 1, wherein said thin film device is a thin film battery.

15. The method of claim 14, wherein said first device layer is a current collector layer and said second device layer is a stack comprising an anode current collector, an anode, an electrolyte and a cathode.

16. The method of claim 14, wherein said first light blocking layer is a layer of gold metal, said layer of gold metal being less than 10 nanometers thick.

17. The method of claim 14, wherein said first heat blocking layer is a layer of indium tin oxide.

18. The method of claim 17, wherein said layer of indium tin oxide is greater than 100 nanometers thick and wherein said laser is a nanosecond pulse width laser.

19. The method of claim 12, wherein the heat and light blocking layer is a layer of thermoelectric material.

* * * * *